United States Patent [19]
Inoue et al.

[11] Patent Number: 5,394,123
[45] Date of Patent: Feb. 28, 1995

[54] LADDER TYPE FILTER COMPRISED OF STACKED TUNING FORK TYPE RESONATORS

[75] Inventors: Jiro Inoue; Hiroaki Kaida, both of Nagaokakyo, Japan

[73] Assignee: Murata Manufacturing Co., Ltd., Kyoto, Japan

[21] Appl. No.: 941,081

[22] PCT Filed: Mar. 12, 1992

[86] PCT No.: PCT/JP92/00300

§ 371 Date: Oct. 9, 1992

§ 102(e) Date: Oct. 9, 1992

[87] PCT Pub. No.: WO92/16997

PCT Pub. Date: Jan. 10, 1992

[30] Foreign Application Priority Data

Mar. 13, 1991 [JP] Japan .................. 3-048251

[51] Int. Cl.⁶ .................. H03H 9/10; H03H 9/21
[52] U.S. Cl. .................. 333/189; 333/191; 333/200; 310/348; 310/370
[58] Field of Search .................. 333/187–192, 333/200; 310/348, 355, 370

[56] References Cited

U.S. PATENT DOCUMENTS

| | | | |
|---|---|---|---|
| 2,639,393 | 5/1953 | Birt et al. | 310/348 |
| 4,564,825 | 1/1986 | Takahashi et al. | 333/191 |
| 5,159,301 | 10/1992 | Kaida et al. | 333/187 |
| 5,159,302 | 10/1992 | Tanaka | 333/189 |

FOREIGN PATENT DOCUMENTS

| | | | |
|---|---|---|---|
| 60-39913 | 3/1985 | Japan . | |
| 66514 | 4/1985 | Japan | 333/191 |
| 61-65511 | 4/1986 | Japan . | |
| 61-162134 | 10/1986 | Japan . | |
| 0648711 | 1/1989 | Japan . | |
| 7610 | 1/1990 | Japan | 333/200 |
| 10909 | 1/1990 | Japan | 333/189 |
| 153611 | 6/1990 | Japan | 333/187 |
| 177104 | 8/1991 | Japan | 333/200 |
| 9200300 | 3/1991 | WIPO . | |

*Primary Examiner*—Benny Lee
*Attorney, Agent, or Firm*—Ostrolenk, Faber, Gerb & Soffen

[57] ABSTRACT

A ladder type filter constructed by laminating serial resonators and parallel resonators, which are respectively constituted by a tuning fork type piezoelectric resonator having a piezoelectric substrate provided with first to third slits extending inward from one edge thereof to form a tuning fork-shaped vibrating portion between the second and third silts, and vibrating electrodes for vibrating the tuning fork-shaped vibrating portion of the piezoelectric substrate. The resonators are laminated with layers having a cavity formed therein interposed in between the resonators. Each layer is constructed so as to ensure that a cavity is provided on both sides of each resonator for allowing the vibration of the tuning fork-shaped vibrating portions. The laminated resonators are integrated to form a ladder type filter which is small in size and can be constructed as an electronic component capable of surface mounting.

14 Claims, 9 Drawing Sheets

LADDER TYPE FILTER COMPRISED OF STACKED TUNING FORK TYPE RESONATORS

FIELD OF THE INVENTION

The present invention relates generally to ladder type filters, and more particularly, to a ladder type filter in which serial resonators and parallel resonators are provided using tuning fork type piezoelectric resonators.

BACKGROUND OF THE INVENTION

Figure 2:
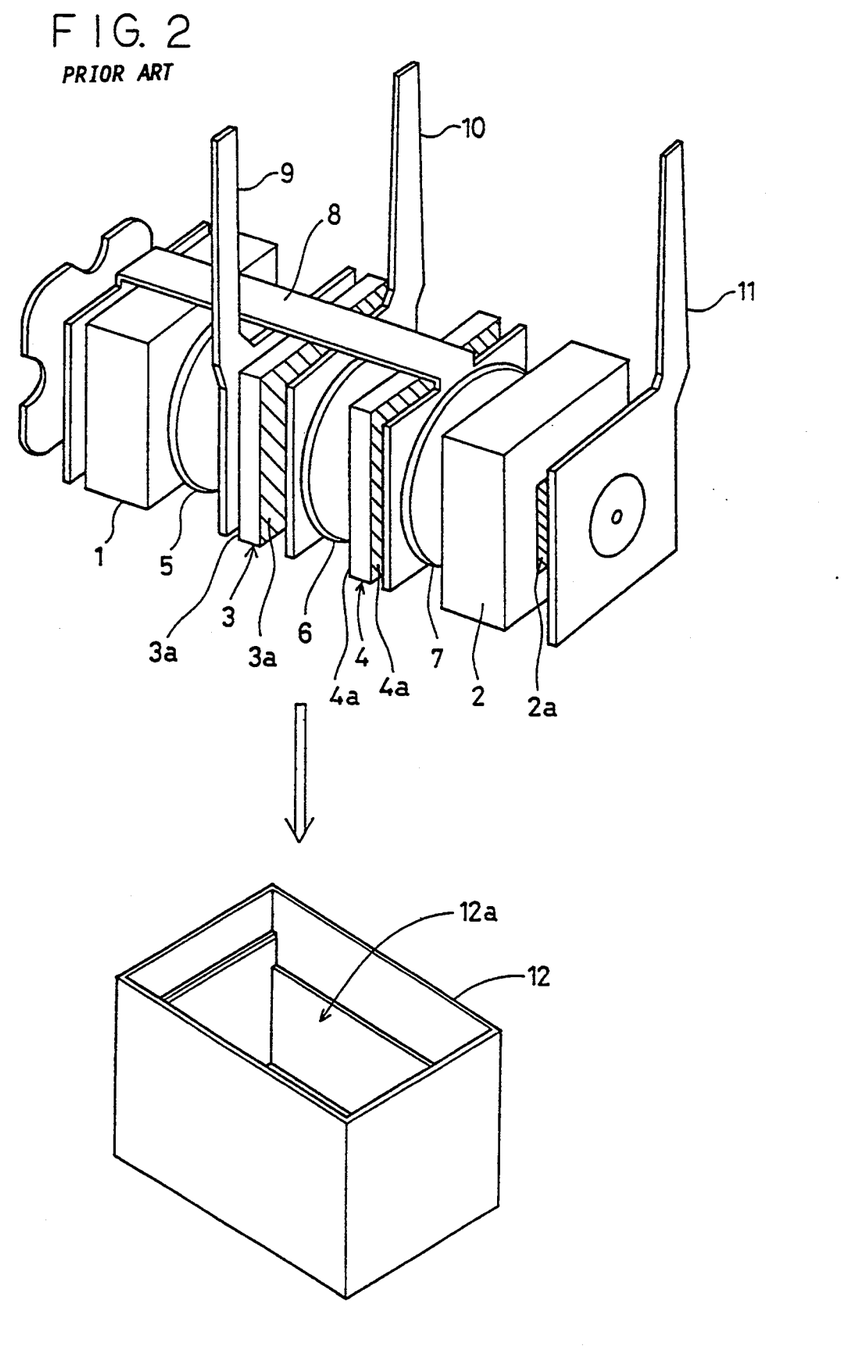
FIG. 2 is an exploded perspective view for explaining the structure of a conventional ladder type filter.

One example of the structure of a conventional ladder type filter is shown in FIG. 2. This conventional ladder type filter is constructed using a plurality of piezoelectric resonators utilizing an extension mode of vibration of a square plate. More specifically, a two-stage ladder type filter containing four elements shown in the circuit diagram of FIG. 3 is constructed using rectangular plate-shaped serial resonators 1 and 2 and rectangular plate-shaped parallel resonators and 4.

In FIG. 2, reference numeral 2a denotes an electrode formed on one major surface of the serial resonator 2. The same electrode is formed on the other major surface of the serial resonator 2. In addition, the same electrodes are formed on both major surfaces of the serial resonator 1. On the other hand, electrodes 3a and 4a are respectively formed on the entire surface of both major surfaces of the parallel resonators 3 and 4.

Figure 3:
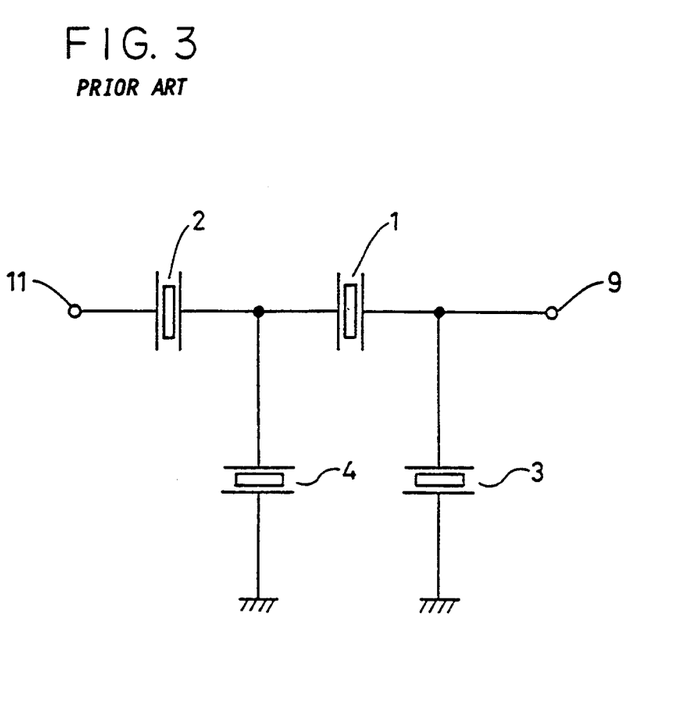
FIG. 3 is a diagram showing a circuit of the conventional ladder type filter.

Furthermore, reference numerals 5 to 11 denote metal terminals, which are used for electrically connecting the serial resonators 1 and 2 and the parallel resonators 3 and 4 to each other, in the manner shown in FIG. 3. The metal terminals 5 to 11, together with the serial resonators 1 and 2 and the parallel resonators 3 and 4, are contained in a case 12 made of an insulating material. In addition, an upper opening 12a of the case 12 is closed by a cover member (not shown), to construct one ladder type filter component. In this case, the metal terminals 9 to 11 extended out of the case 12, and are utilized as connecting terminals to the exterior. As shown in FIG. 3, the metal terminals 9, 11 are used as electrodes for the circuit of the conventional ladder type filter.

Meanwhile, when the above described ladder type filter is driven, the serial resonators 1 and 2 and the parallel resonators 3 and 4, which are contained in the case 12 must be vibrated in a desired manner. More specifically, the vibration of each of the resonators 1 to 4 must not be prevented by the case 12 in which the resonators 1 to 4 are contained. Therefore, a so-called spring terminal having spring properties is used as the metal terminal 11 positioned at an end of the ladder type filter.

In the ladder type filter shown in FIG. 2, a spring terminal is used as the metal terminal 11 so as not to prevent the vibration of the resonators 1 to 4, when the resonators 1-4 are contained in the case 12. Accordingly, additional space is required in the case 12 thereby significantly increasing the overall size of the ladder type filter. For example, the two-stage ladder type filter containing four elements as shown in FIG. 2 measures approximately 7.0 mm by 8.0 mm by 8.0 mm thick when it is constructed as a final ladder type filter component.

Furthermore, in recent years, there has been a demand for a ladder type filter, which in a manner similar to other electronic components is constructed as a surface mounted type electronic component.

OBJECT OF THE INVENTION

Accordingly, an object of the present invention is to provide a ladder type filter which can be constructed as a surface mounted type electronic component and is small in overall size.

DISCLOSURE OF THE INVENTION

The present invention provides a ladder type filter, which is constructed by connecting at least one serial resonator and at least one parallel resonator, having the following structure.

More specifically, in the present invention, a tuning fork type piezoelectric resonator is used as the serial resonator and the parallel resonator. The tuning fork type piezoelectric resonator is constructed by forming second and third slits extending inward from one edge of a piezoelectric substrate such that a first slit extending inward from the one edge thereof is interposed therebetween so as to form a tuning fork-shaped vibrating portion between the second and third slits, and forming electrodes on the piezoelectric substrate for vibrating the tuning fork-shaped vibrating portion. In the ladder type filter according to the present invention, a plurality of tuning fork type piezoelectric resonators, constituting the above described serial resonator and parallel resonator are laminated through layers having a cavity interposed therebetween. The layers having a cavity are interposed so as to form a cavity on both sides of each vibrating portion thereby permitting the vibration of the tuning fork-shaped vibrating portions of the tuning fork type piezoelectric resonators on both its sides. The plurality of piezoelectric resonators are laminated and are integrated to construct a laminated body.

In the present invention, the ladder type filter is constructed by laminating a plurality of tuning fork type piezoelectric resonators, each constructed using a piezoelectric substrate, through layers having a cavity formed therein, and integrating them, that is, by laminating and integrating the tuning fork type piezoelectric resonators without using a spring terminal. Accordingly, it is possible to significantly decrease the overall size of the ladder type filter and to particularly decrease the thickness thereof.

Moreover, the ladder type filter is constructed by laminating and integrating a plurality of tuning fork type piezoelectric resonators. Accordingly, it is possible to provide the ladder type filter as a chip type electronic component capable of easy surface mounting by providing outer electrodes.

BEST MODE FOR CARRYING OUT THE INVENTION

Figure 1:
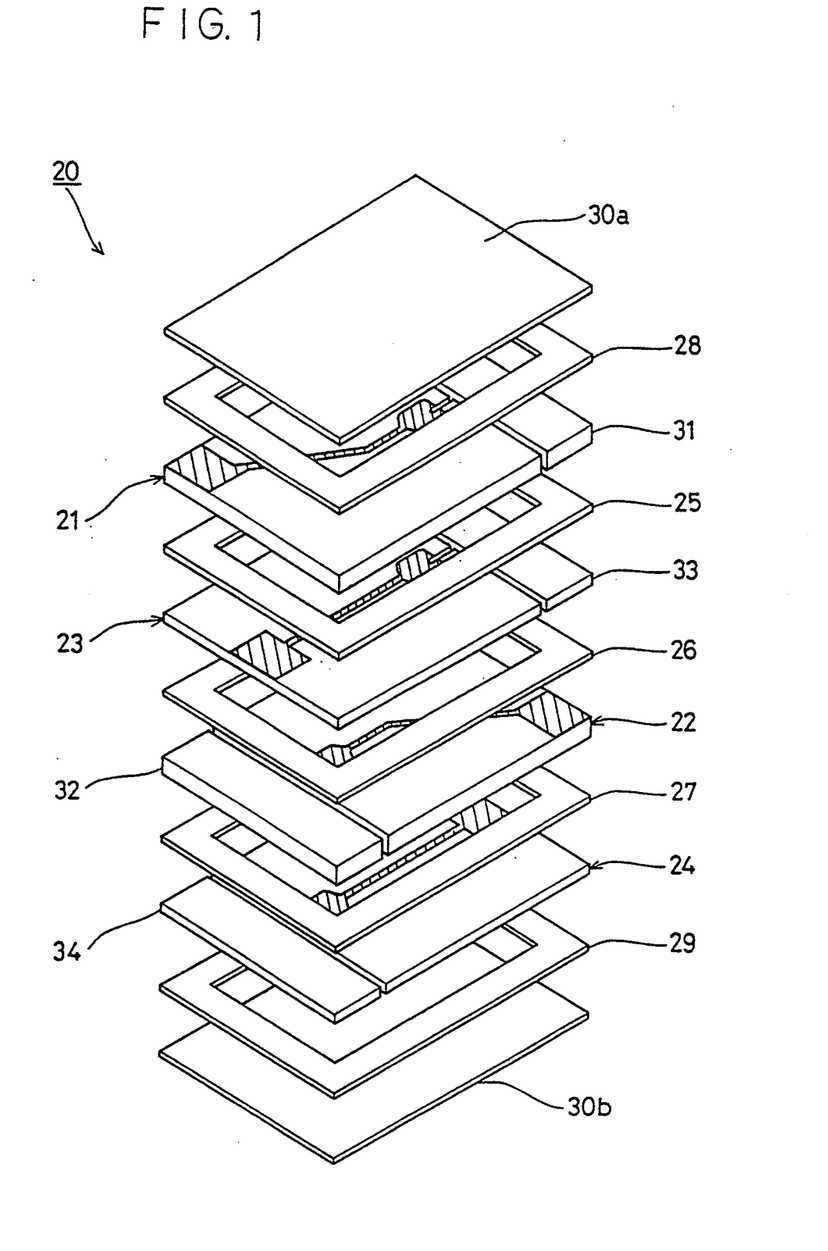
FIG. 1 is an exploded perspective view showing the entire structure of a ladder type filter according to one embodiment of the present invention.

FIG. 1 is an exploded perspective view showing main parts of a ladder type filter according to an embodiment of the present invention. In a ladder type filter 20 according to the present embodiment, serial resonators 21 and 22 and parallel resonators 23 and 24 are alternately laminated as shown in FIG. 1, to construct a two-stage ladder type filter containing four elements. In FIG. 1, the serial resonators 21 and 22 and the parallel resonators 23 and 24 are laminated through layers 25, 26, 27 interposed therebetween, each layer having a cavity formed in it. In addition, substrates 30a and 30b are laminated above and below the laminated body obtained by laminating the resonators 21 to 24. The substrates 30a, 30b are laminated through layers 28, 29 having cavities formed therein.

Beside the serial resonators 21 and 22 and the parallel resonators 23 and 24, spacers 31, 32, 33, 34 having the same thickness as those of the resonators 21 to 24 are respectively disposed in the manner shown in FIG. 1.

Referring now to FIGS. 4 to 9, description is made of the details of the serial resonators 21 and 22 and the parallel resonators 23 and 24.

Figure 4:
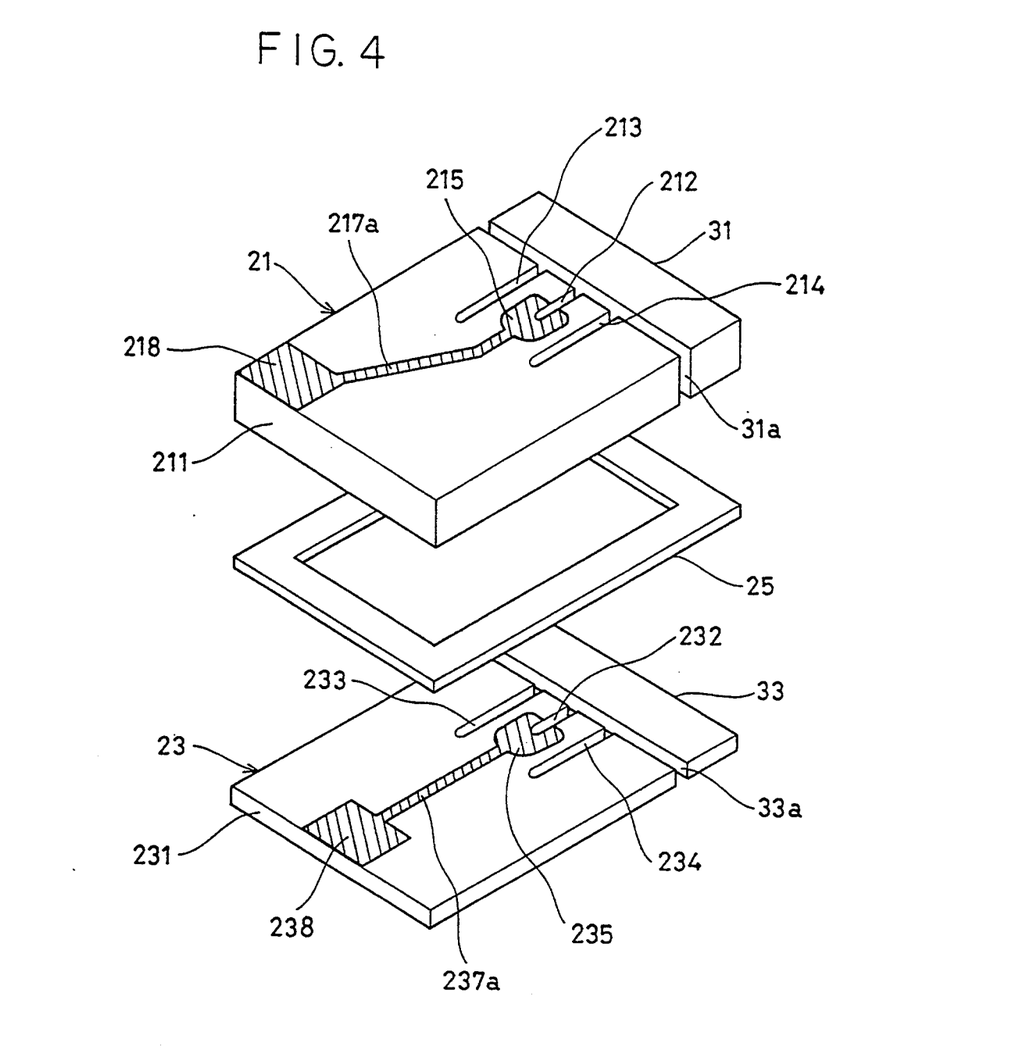
FIG. 4 is an exploded perspective view showing main parts of the ladder type filter according to the embodiment shown in FIG. 1.

As shown in the exploded perspective view of FIG. 4, the serial resonator 21 has a structure in which first to third slits 212, 213, 214 are formed so as to extend inward from one edge of a piezoelectric substrate 211 to form a tuning fork-shaped vibrating portion between the second and third slits 213 and 214. A vibrating electrode 215 is formed in the tuning fork-shaped vibrating portion on an upper surface of the piezoelectric substrate 211. In addition, as apparent from FIG. 6, which showed only the electrodes formed on both major surfaces of the serial resonator 21 in an exploded manner, a vibrating electrode 216 is also formed on a lower surface of the piezoelectric substrate 211 so as to be opposed to the vibrating electrode 215. Consequently, the tuning fork-shaped vibrating portion between the second and third slits 213 and 214 is vibrated as a piezoelectric tuning fork by applying an AC voltage from the vibrating electrodes 215 and 216.

Figure 6:
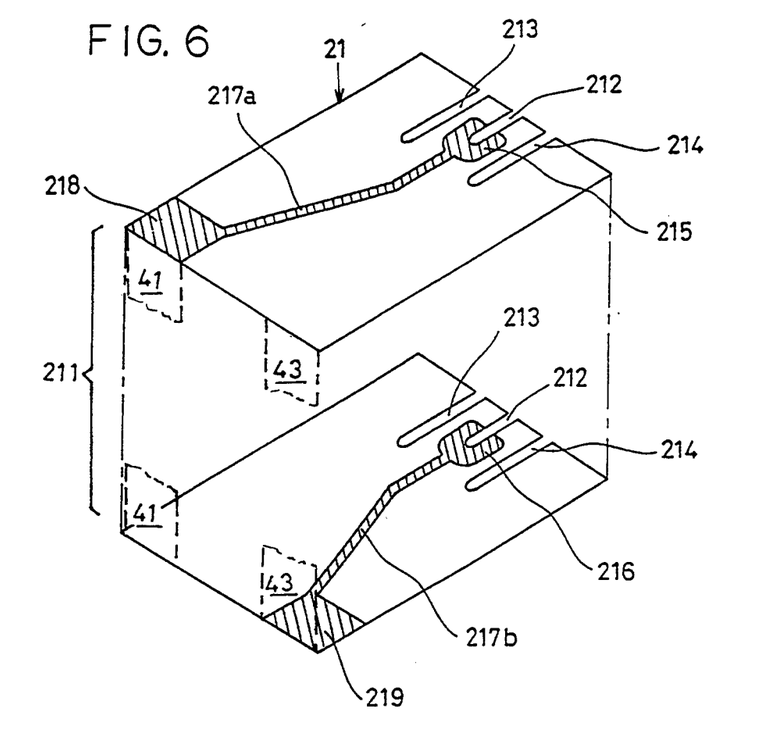
FIG. 6 is a schematic exploded perspective view for explaining an electrode pattern of one serial resonator.

In FIG. 6, reference numerals 217a and 217b denote connecting conductive parts. The vibrating electrodes 215 and 216 are respectively pulled out to terminal electrodes 218 and 219 by the connecting conductive parts 217a and 217b. In the serial resonator 21, the vibrating electrodes 215 and 216 formed on both the major surfaces thereof are pulled out to the terminal electrodes 218 and 219 formed in different corners of the piezoelectric substrate 211, as apparent from FIGS. 4 and 6.

Referring to FIG. 4, a spacer 31 is disposed ahead of a part where the tuning fork-shaped vibrating portion of the serial resonator 21 is formed with a gap 31a being interposed therebetween. The gap 31a is provided so as not to prevent the vibration of the tuning fork-shaped vibrating portion.

The upper serial resonator 21 and the spacer 31 are laminated on the lower parallel resonator 23 and spacer 33 through a rectangular frame-shaped layer 25 having a cavity formed therein. The rectangular frame-shaped layer 25 is provided so that the cavity formed therein permits free vibration of the tuning fork-shaped vibrating portions of the upper serial resonator 21 and the lower parallel resonator 23. The layer 25 is composed of a frame-shaped member having an opening or cavity formed. This layer 25 can be constructed by applying adhesives in between the adjacent resonators, and finally curing the adhesives so as to have a rectangular frame shape as shown or by using elastic rubber, synthetic resin or the like formed in a rectangular frame shape as shown. In either case, the layer 25 must be constructed so as to have a predetermined thickness as shown so as not to prevent the vibration of the upper and lower tuning fork-shaped vibrating potions.

Figure 7:
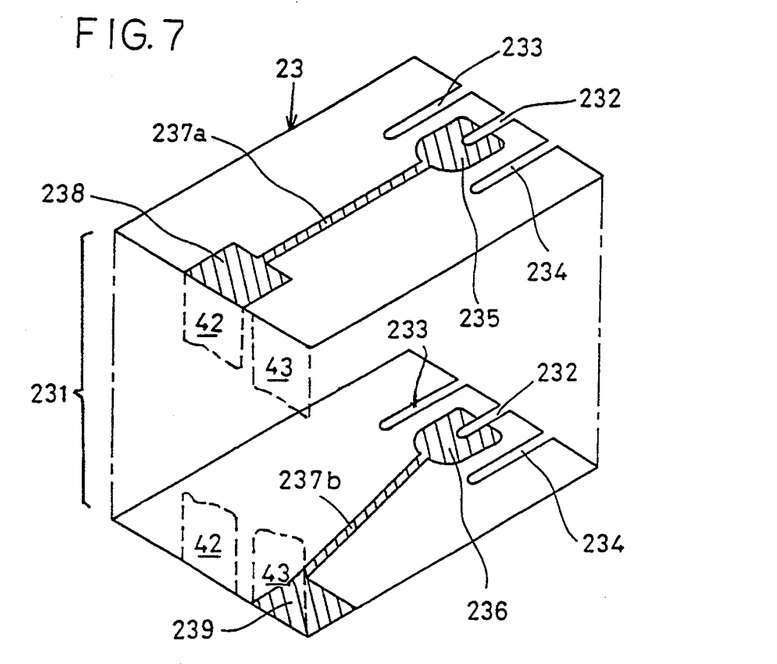
FIG. 7 is a schematic perspective view for explaining an electrode pattern of one parallel resonator.

The parallel resonator 23 has a structure in which first to third slits 232, 233, 234 are formed on a piezoelectric substrate 231 and vibrating electrodes 235 and 236 as shown in FIG. 7 are formed on both its major surfaces. The vibrating electrodes 235 and 236 are respectively pulled out to terminal electrodes 238 and 239 by connecting conductive parts 237a and 237b. As apparent from FIGS. 4 and 7, one of the terminal electrodes 238 in the parallel resonator 23 is formed in the center of an edge of the piezoelectric substrate 231, while the other terminal electrode 239 is formed in one corner of the piezoelectric substrate 231 (see FIG. 7).

Figure 5:
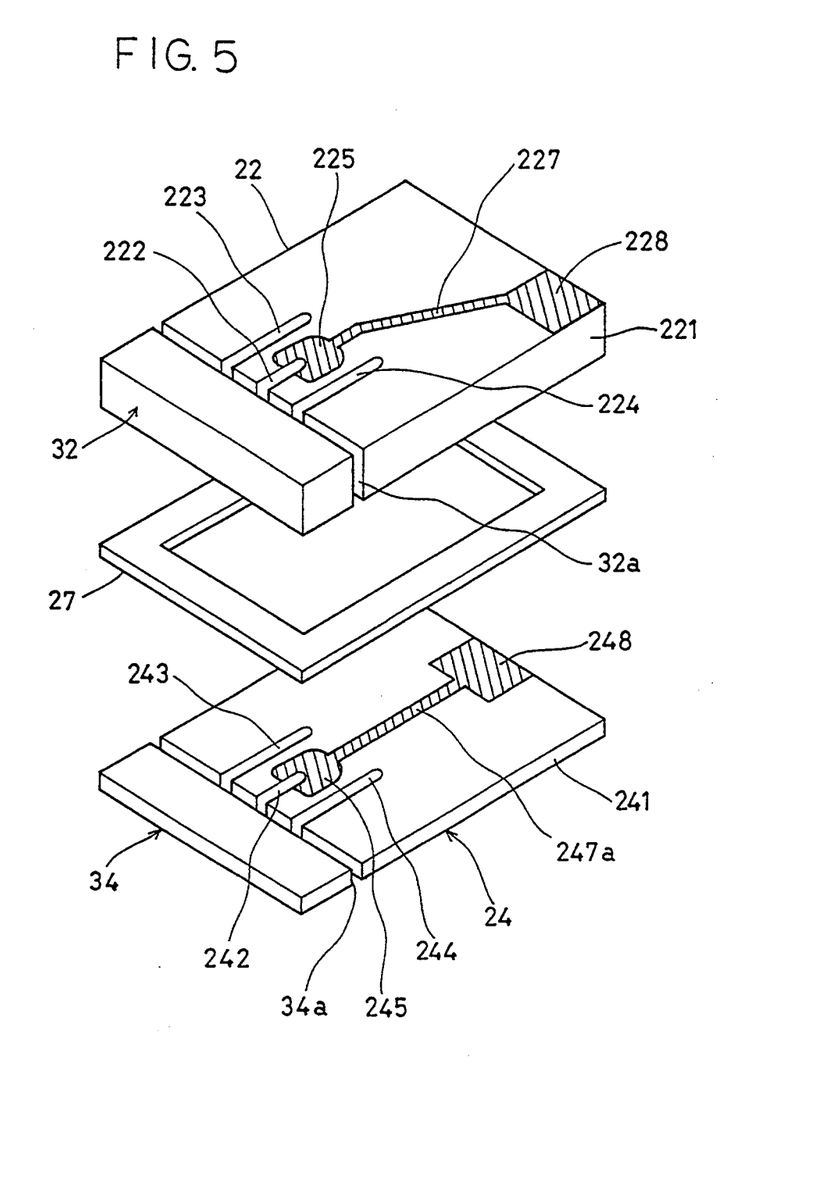
FIG. 5 is an exploded perspective view showing the other main parts of the ladder type filter according to the embodiment shown in FIG. 1.
Figure 8:
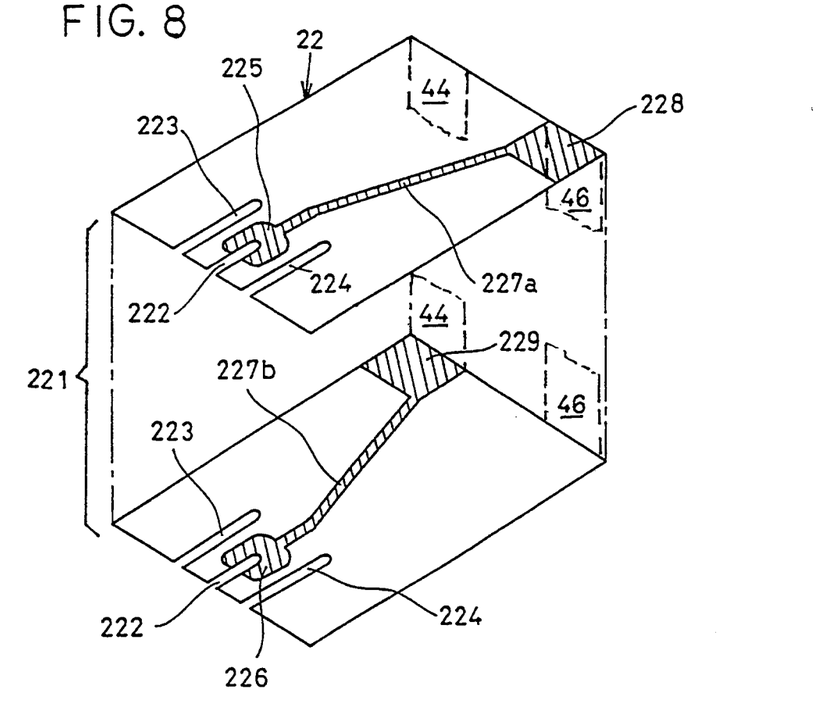
FIG. 8 is a schematic exploded perspective view for explaining an electrode pattern of another serial resonator.
Figure 9:
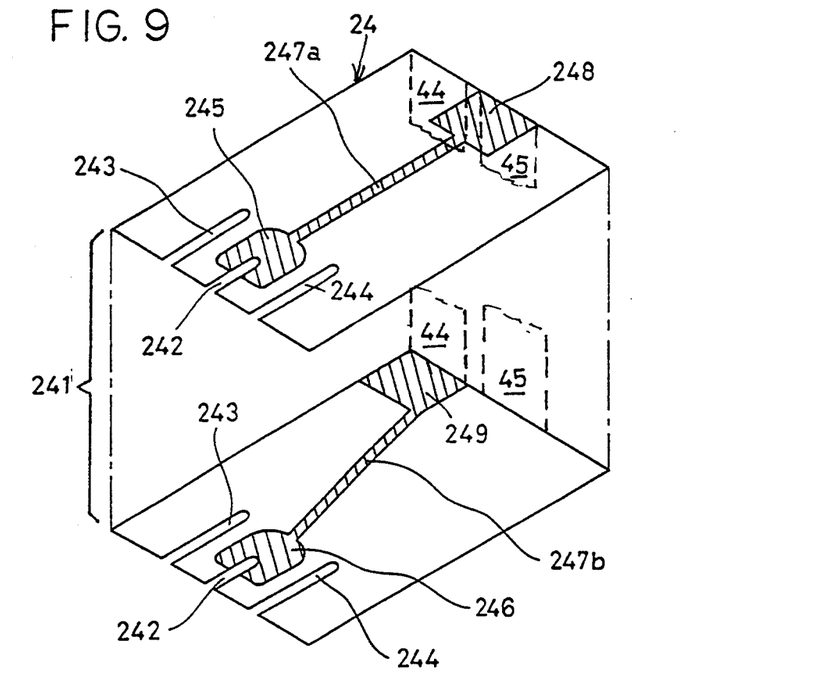
FIG. 9 is a schematic exploded perspective view for explaining an electrode pattern of another parallel resonator.

FIG. 5 and FIGS. 8 and 9 show the details of a part of the ladder type filter where the serial resonator 22 and the parallel resonator 24 shown in FIG. 1 are laminated, which correspond to FIG. 4 and FIGS. 6 and 7 used for explaining the upper serial resonator 21 and parallel resonator 23. Consequently, in FIGS. 5, 8 and 9 the lower serial resonator 22 and parallel resonator 24, the layer 27, having a cavity and the spacers 32 and 34 are assigned reference numerals that are similar to those used in FIGS. 1, 4, 6 and 7 (some of the reference numerals being incremented by 10 so as to designate similar but not identical elements), and hence, the detailed description thereof is omitted.

In one embodiment, the thickness of the piezoelectric substrate of the tuning fork type piezoelectric resonator constituting the serial resonators is made larger than the thickness of the piezoelectric substrate of the tuning fork type piezoelectric resonator constituting the parallel resonators.

Figure 10:
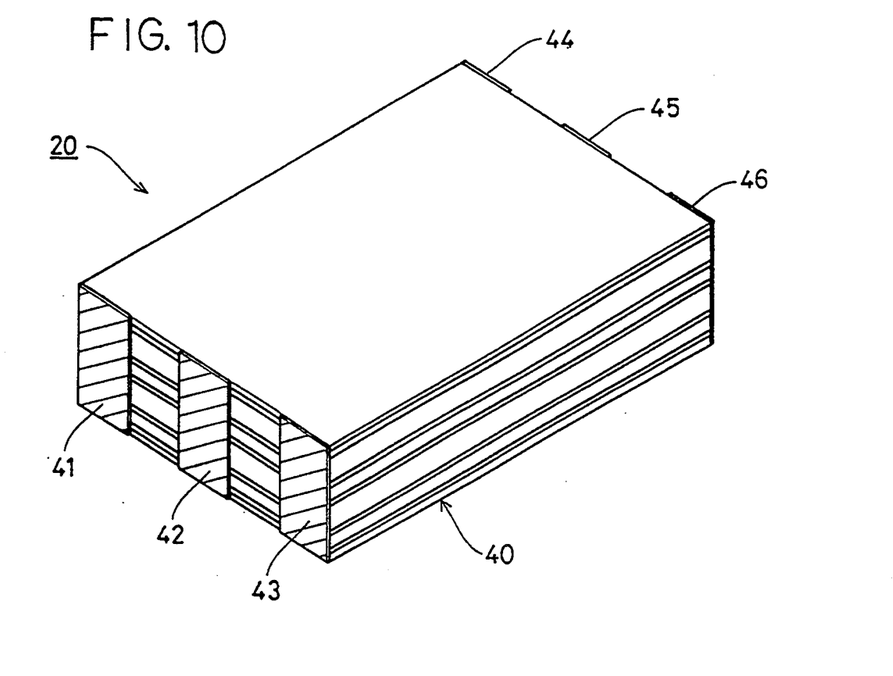
FIG. 10 is a perspective view showing the appearance of a ladder type filter according to the embodiment.

The ladder type filter according to the present embodiment is constructed by laminating and integrating the components shown in FIG. 1. More specifically, as shown in FIG. 10, outer electrodes 41, 42, 43, 44, 45, 46 are formed on both end faces of a laminated body 40 constructed by laminating and integrating the components shown in FIG. 1, to obtain the ladder type filter 20 according to the present embodiment. As apparent from FIGS. 6 to 9 together with FIG. 10, the outer electrode 41 is connected to the terminal electrode 218 in the serial resonator 21, the outer electrode 42 is connected to the terminal electrode 238 in the parallel resonator 23, and the outer electrode 43 is connected to the terminal electrode 219 in the serial resonator 21 and the terminal electrode 239 in the parallel resonator 23. Similarly, the outer electrode 44 is connected to the terminal electrode 229 in the serial resonator 22 and the terminal electrode 249 in the parallel resonator 24, the outer electrode 45 is connected to the terminal electrode 248 in the parallel resonator 24, and the outer electrode 46 is connected to the terminal electrode 228 in the serial resonator 22.

Figure 11:
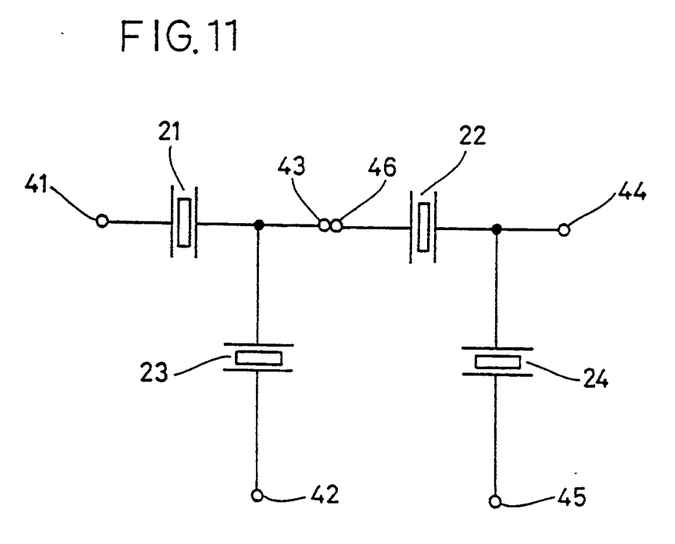
FIG. 11 is a diagram showing a circuit of the ladder type filter according to the embodiment.

The outer electrode 43 and the outer electrode 46 are connected to each other on an outer surface of the laminated body 40 or outside of the laminated body 40, thereby to construct a ladder type filter shown in FIG. 11. FIG. 11 shows the circuit of the ladder type filter 20 shown in FIGS. 1 and 10, wherein like reference numerals designate the same elements.

As apparent from FIGS. 1 and 10, the ladder type filter 20 according to the present embodiment has a structure in which the serial resonators 21 and 22 and the parallel resonators 25 and 24 are constituted by tuning fork type piezoelectric resonators, which are constructed using a piezoelectric substrate. The resonators 21, 22, 23, 24 are laminated through the layers 25, 26, 27 and are integrated so as to form a laminated body. Accordingly, the ladder type filter 20 can be constructed as a ultrathin component having a very small overall thickness. When the above described two-stage ladder type filter containing 21, 22, the four elements 21, 22, 23, 24 is actually fabricated, it measures 6.2 mm by 5.0 mm by 2.0 mm. Consequently, it is found that the overall size of the ladder type filter 20 is significantly smaller, as compared with the conventional ladder type filter shown in FIG. 2. Moreover, the ladder type filter 20 can be electrically connected to the exterior using the above described outer electrodes 41 to 46 (shown in FIGS. 6–11). Accordingly, it is found that the ladder type filter 20 can be provided as a chip type electronic component capable of surface mounting.

Although in the above described embodiment, description was made of a case where a ladder type filter comprising two stages is constructed using two serial resonators and two parallel resonators, a ladder type filter comprising an arbitrary number of stages which are not less than one can be constructed according to the present invention.

Figure 12:
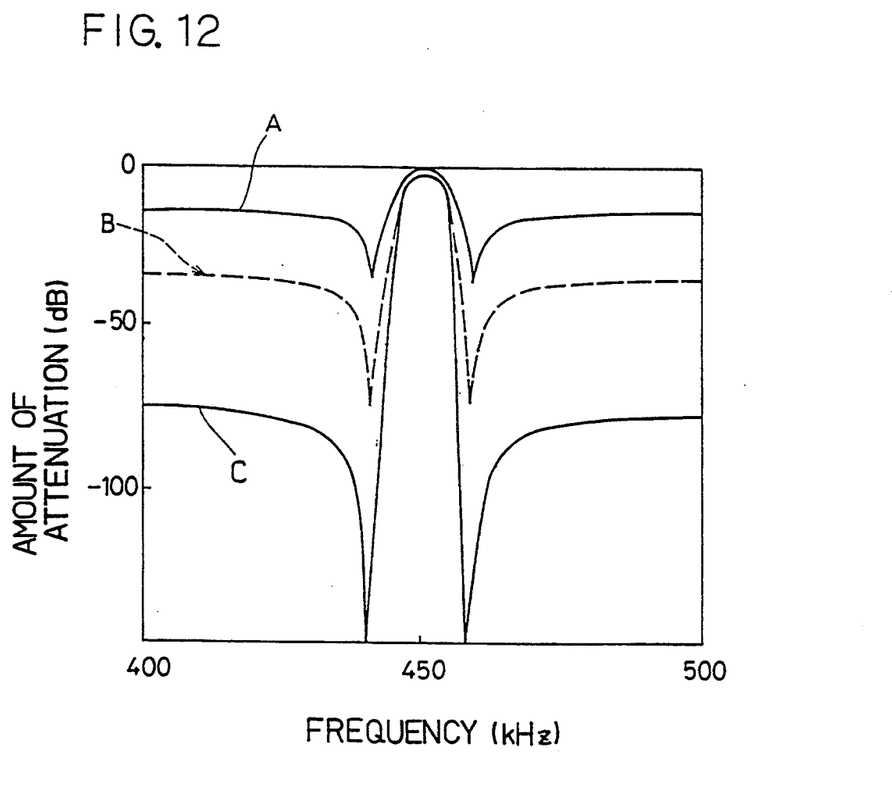
FIG. 12 is a diagram showing attenuation-frequency characteristics of ladder type filters according to the present invention.

FIG. 12 shows attenuation-frequency characteristics of the ladder type filter according to the present invention.

The characteristics represented by a solid line A, a broken line B and a solid line C shown in FIG. 12 are respectively characteristics in cases where a ladder type filter comprising one stage, a ladder type filter comprising two stages, and a ladder type filter comprising four stages (formed by connecting two ladder type filters each comprising two stages), respectively. The capacitance of a tuning fork type piezoelectric resonator used for constructing each of the ladder type filters is as follows:

the serial resonator . . . 35 pF, and
the parallel resonator . . . 350 pF.

Furthermore, the insertion loss of each of the ladder type filters exhibiting the attenuation-frequency characteristics shown in FIG. 12 is as follows:

the ladder type filter comprising one stage (represented by the solid line A) . . . 1.1 dB, the ladder type filter comprising two stages (represented by the broken line B) . . . 2.1 dB, and the ladder type filter constructed by connecting to each other two ladder type filters each comprising two stages, that is, the ladder type filter comprising four stages (represented by the solid line C) . . . 4.2 dB.

Meanwhile, the tuning fork type piezoelectric resonator used in the present invention is not limited to one having an electrode structure described with reference to FIGS. 6 to 9. More specifically, a tuning fork type piezoelectric resonator having vibrating electrodes of another pattern can be applied to the present invention, provided that it has a structure in which first to third slits extending from one edge of a piezoelectric substrate are formed so as to form a tuning fork-shaped vibrating portion in a portion thereof between the second and third slits.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed:

1. A ladder type filter, comprising a plurality of tuning fork type piezoelectric resonators including at least two serial tuning fork type resonators and at least one parallel tuning fork type resonator, the serial resonators being connected in series between input and output electrodes and the parallel resonator being connected in parallel to a connection between the serial resonators, each tuning fork type piezoelectric resonator having at least two sides and comprising a piezoelectric substrate provided with first, second and third slits extending inward from a first edge thereof, said first slit being interposed in between said second and third slits thereby defining a tuning fork-shaped vibrating portion between said second and third slits, and electrodes operatively connected to said tuning fork-shaped vibrating portion for vibrating said tuning fork-shaped vibrating portion of said piezoelectric substrate;

a plurality of layers each having a cavity provided therein, respective layers of said plurality being interposed between said plurality of tuning fork type piezoelectric resonators such that a cavity of said respective layers is provided at each of said two sides of said each tuning fork type piezoelectric resonator so as to allow vibration of the corresponding tuning fork-shaped vibrating portion, wherein said plurality of tuning fork type piezoelectric resonators are laminated with said plurality of layers interposed therebetween so as to comprise a laminated body, which further comprises spacers each disposed beside a corresponding one of said plurality of tuning fork type piezoelectric resonators so as to be spaced a predetermined distance away from said first edge of the corresponding piezoelectric substrate, and having a thickness, said thickness of each of said spacers being substantially equal to a corresponding thickness of the corresponding one of said plurality of tuning fork type piezoelectric resonators, said spacers being respectively fixed to said plurality of layers interposed therebetween.

2. The ladder type filter according to claim 1, wherein each said piezoelectric substrate has two major surfaces respectively comprised by the at least two sides of each tuning fork type piezoelectric resonator, and said electrodes operatively connected to the tuning fork-shaped vibrating portion of said each tuning fork type piezoelectric resonator are a pair of vibrating electrodes, said pair of vibrating electrodes being provided on said both major surfaces of each said piezoelectric substrate, respectively, so as to be opposed to each other through the corresponding piezoelectric substrate in the vicinity of a periphery of the corresponding first slit.

3. The ladder type filter according claim 2, which further comprises a respective pair of terminal electrodes disposed so as to be electrically connected to the vibrating electrodes provided on said both major surfaces of each said piezoelectric substrate, respectively, and so as to lead to a second edge of said piezoelectric substrate located opposite from said first edge.

4. The ladder type filter according to claim 3, wherein each said second edge has two ends, each end having corresponding corners, each terminal electrode being disposed along the corresponding second edge opposite said first edge of the piezoelectric substrate of said serial resonator is disposed so as to be in the vicinity of one of the corners.

5. The ladder type filter according to claim 4, wherein each pair of terminal electrodes provided on said both major surfaces of the corresponding piezoelectric substrate of said serial resonator, respectively, are provided in different corners of said ends of said second edge.

6. The ladder type filter according to claim 5, wherein each said second edge has a center region and the terminal electrode disposed along the second edge of the piezoelectric substrate of said parallel resonator is disposed so as to be along the center region of the second edge.

7. The ladder type filter according to any one of claims 3 to 6, wherein said laminated body has outer side surfaces, and which further comprises a plurality of outer electrodes comprised on said outer side surfaces of said laminated body and configured so as to be electrically connected to predetermined terminal electrodes that extend out of said plurality of terminal electrodes.

8. A ladder type filter, comprising a plurality of tuning fork type piezoelectric resonators including at least two serial tuning fork type resonators and at least one parallel tuning fork type resonator, the serial resonators being connected in series between input and output electrodes and the parallel resonator being connected in parallel to a connection between the serial resonators, each tuning fork type piezoelectric resonator having at least two sides and comprising a piezoelectric substrate provided with first, second and third slits extending inward from a first edge thereof, said first slit being interposed in between said second and third slits thereby defining a tuning fork-shaped vibrating portion between said second and third slits, and electrodes operatively connected to said tuning fork-shaped vibrating portion for vibrating said tuning fork-shaped vibrating portion of said piezoelectric substrate;

a plurality of layers each having a cavity provided therein, respective layers of said plurality being interposed between said plurality of tuning fork type piezoelectric resonators such that a cavity of said respective layers is provided at each of said two sides of said each tuning fork type piezoelectric resonator so as to allow vibration of the corresponding tuning fork-shaped vibrating portion, wherein said plurality of tuning fork type piezoelectric resonators are laminated with said plurality of layers interposed therebetween so as to comprise a laminated body, and wherein each said piezoelectric substrate has a respective thickness, the respective thickness of the piezoelectric substrate of the tuning fork type piezoelectric resonator constituting said serial resonator is larger than the corresponding thickness of the piezoelectric substrate of the tuning fork type piezoelectric resonator constituting said parallel resonator.

9. The ladder type filter according to claim 8, wherein each said piezoelectric substrate has two major surfaces respectively comprised by the at least two sides of each tuning fork type piezoelectric resonator, and said electrodes operatively connected to the tuning fork-shaped vibrating portion of said each tuning fork type piezoelectric resonator Are a pair of vibrating electrodes, said pair of vibrating electrodes being provided on said both major surfaces of each said piezoelectric substrate, respectively, so as to be opposed to each other through the corresponding piezoelectric substrate in the vicinity of a periphery of the corresponding first slit.

10. The ladder type filter according to claim 9, which further comprises a respective pair of terminal electrodes disposed so as to be electrically connected to the vibrating electrodes provided on said both major surfaces of each said piezoelectric substrate, respectively, and so as to lead to a second edge of said piezoelectric substrate located opposite from said first edge.

11. The ladder type filter according to claim 10, wherein each said second edge has two end, each end having corresponding corners, each terminal electrode being disposed along the corresponding second edge opposite said first edge of the piezoelectric substrate of said serial resonator is disposed so as to be in the vicinity of one of the corners.

12. The ladder type filter according to claim 11, wherein each pair of terminal electrodes provided on said both major surfaces of the corresponding piezoelectric substrate of said serial resonator, respectively, are provided in different corners of said ends of said second edge.

13. The ladder type filter according to claim 12, wherein said each second edge has a center region and the terminal electrode disposed along the second edge of the piezoelectric substrate of said parallel resonator is disposed so as to be along the center region of the second edge.

14. The ladder type filter according to any one of claims 10–13, wherein said laminated body has outer side surfaces, and which further comprises a plurality of outer electrodes comprised on said outer side surfaces of said laminated body and configured so as to be electrically connected to predetermined terminal electrodes that extend out of said plurality of terminal electrodes.

* * * * *